(12) United States Patent
Shimbori (10) Patent No.: US 7,172,848 B2
(45) Date of Patent: Feb. 6, 2007

(54) CHEMICAL AMPLIFICATION TYPE POSITIVE RESIST COMPOSITION

(75) Inventor: Hiroshi Shimbori, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 0 days.

(21) Appl. No.: 10/548,843

(22) PCT Filed: Mar. 11, 2004

(86) PCT No.: PCT/JP2004/003162

§ 371 (c)(1),
(2), (4) Date: Sep. 9, 2005

(87) PCT Pub. No.: WO2004/081665

PCT Pub. Date: Sep. 23, 2004

(65) Prior Publication Data

US 2006/0194140 A1    Aug. 31, 2006

(30) Foreign Application Priority Data

Mar. 14, 2003  (JP) .............................. 2003-370877
Dec. 26, 2003  (JP) .............................. 2003-432686

(51) Int. Cl.
    *G03C 1/00*      (2006.01)
(52) U.S. Cl. .................... 430/270.1; 430/913; 430/914
(58) Field of Classification Search ............ 430/270.1, 430/913, 914
    See application file for complete search history.

(56) References Cited

U.S. PATENT DOCUMENTS

| 5,780,206 A | 7/1998 | Urano et al. |
| 6,235,446 B1 | 5/2001 | Ikemura et al. |
| 6,458,506 B2 * | 10/2002 | Cameron ................. 430/270.1 |
| 6,479,210 B2 * | 11/2002 | Kinoshita et al. ........ 430/270.1 |
| 2002/0058200 A1 | 5/2002 | Fujimori et al. |
| 2003/0060055 A1 | 3/2003 | Kamijima |

FOREIGN PATENT DOCUMENTS

| EP | 537879 A1 | 4/1993 |
| EP | 675410 A1 | 10/1995 |
| JP | 5-181265 | 7/1993 |
| JP | 5-204157 | 8/1993 |
| JP | 6-83058 A | 3/1994 |
| JP | 7-319155 | 12/1995 |
| JP | 11-65120 | 3/1999 |
| JP | 2002-90988 | 3/2002 |
| JP | 2002-100536 A | 4/2002 |

* cited by examiner

*Primary Examiner*—Geraldina Visconti
(74) *Attorney, Agent, or Firm*—Knobbe Martens Olson & Bear LLP (57) ABSTRACT

There is provided a positive resist composition which enables the formation of a fine resist pattern, enables the angle of the taper shape within that resist pattern to be controlled to a suitable angle, and enables the formation of a resist pattern with an excellent depth width of focus. This positive resist composition is formed from a chemically amplified positive resist composition in which the light transmittance of a resist film of thickness 0.3 µm, relative to light of wavelength 248 nm, is within a range from 20 to 75%.

7 Claims, 4 Drawing Sheets

CHEMICAL AMPLIFICATION TYPE POSITIVE RESIST COMPOSITION

CROSS REFERENCE TO RELATED APPLICATIONS

This application is the U.S. National Phase under 35 U.S.C. §371 of International Application PCT/JP04/003162, filed Mar. 11, 2004, which claims priority to Japanese Patent Application No. 2003-070877, filed Mar. 14, 2003 and Japanese Patent Application No. 2003-432686, filed Dec. 26, 2003. The International Application was published under PCT Article 21(2) in a language other than English.

TECHNICAL FIELD

The present invention relates to a positive resist composition with suppressed transmittance, wherein the transmittance of a specified resist film formed from a chemically amplified positive resist composition, relative to radiation of wavelength 248 nm, is regulated within a specific range, as well as a method of forming a magnetic film pattern using that type of resist composition.

BACKGROUND ART

Increases in the recording densities on magnetic recording media continue to occur at a remarkable rate, and in order to meet future demands for further increases in recording density, further miniaturization of the magnetic heads must be achieved.

For example, in the read portion (the head portion used for reading) of a magnetic head, not only must a fine resist pattern (isolated pattern) be formed, thereby enabling the formation of a fine magnetic film pattern, but the shape of this magnetic film pattern must be close to being substantially rectangular.

Normally, the production of fine structures within the read portion of a magnetic head uses a method in which the magnetic film is subjected to ion etching, and an example of this method is described below. Ion milling is a widely used form of ion etching. FIG. 1A through FIG. 1E show schematic illustrations (side sectional views) of each of the steps in the formation of an electrode using typical ion milling and sputtering.

Figure 1A:
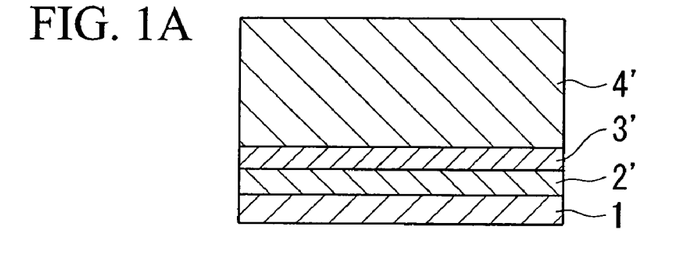
FIG. 1A through FIG. 1E are schematic illustrations describing the steps for forming a magnetic film pattern using an ion etching method in which a resist pattern is used as a mask.
Figure 1B:
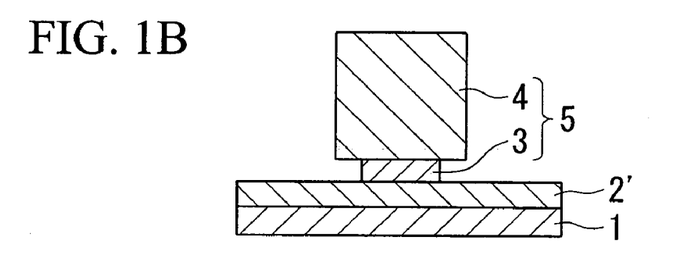

First, as shown in FIG. 1A, a magnetic film 2' is laminated on top of a substrate 1, and a base film 3' that is soluble in alkali developing solution, and a resist film 4' are then laminated sequentially on top of the magnetic film 2'. Subsequently, selective irradiation is conducted through a mask pattern from above the resist film 4', using a light source such as i-line radiation or a KrF excimer laser. Alkali developing is then conducted, thereby dissolving certain areas of the resist film 4' (the exposed portions in the case of a positive resist, or the unexposed portions in the case of a negative resist), and generating a resist pattern 4 with a substantially rectangular cross section. At this point, the base film 3' positioned below those portions of the resist film 4' removed by the alkali developing is also removed by the developing solution, and because the base film 3' has a higher level of alkali solubility than the resist film 4', the alkali developing generates a lift-off pattern 5 such as that shown in FIG. 1B, which includes a base film 3' pattern 3 of narrow width, and a resist pattern 4 of the resist film 4' of greater width.

Figure 1C:
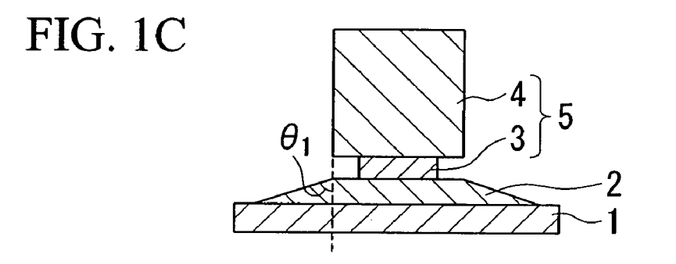

When ion milling is then conducted using this pattern 5 as a mask, then as shown in FIG. 1C, the magnetic film 2' surrounding the pattern 5 is etched away, forming a magnetic film pattern 2 beneath the pattern 5 and in the immediate vicinity thereof.

Figure 1D:
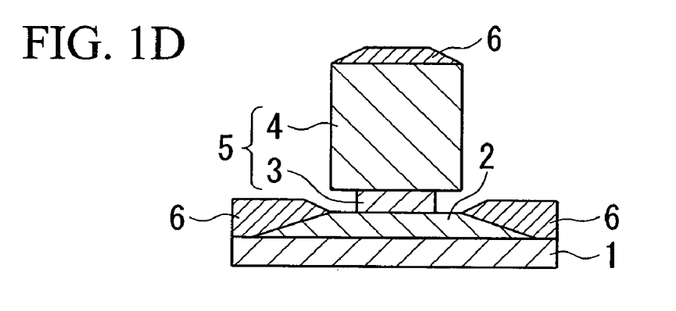

When sputtering is then conducted, an electrode film 6 is formed on top of the pattern 5, and on top of the substrate 1 in the vicinity of the magnetic film pattern 2, as shown in FIG. 1D.

Figure 1E:
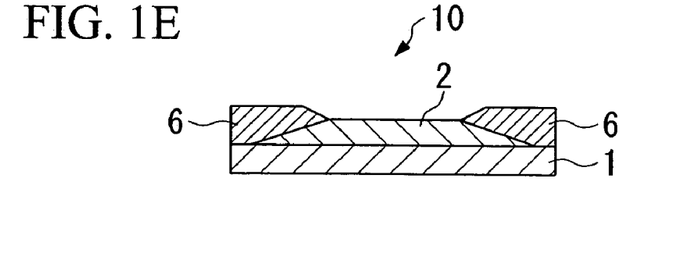

Finally, when an alkali developing solution is then used to dissolve the pattern 3 of the base film 3', the resist pattern 4 of the resist film 4' is removed, and a magnetic head 10 such as that shown in FIG. 1E, including the substrate 1, the magnetic film pattern 2 of a predetermined width formed on top of the substrate 1, and the electrode film 6 formed surrounding the pattern 2, can be obtained.

Figure 2A:
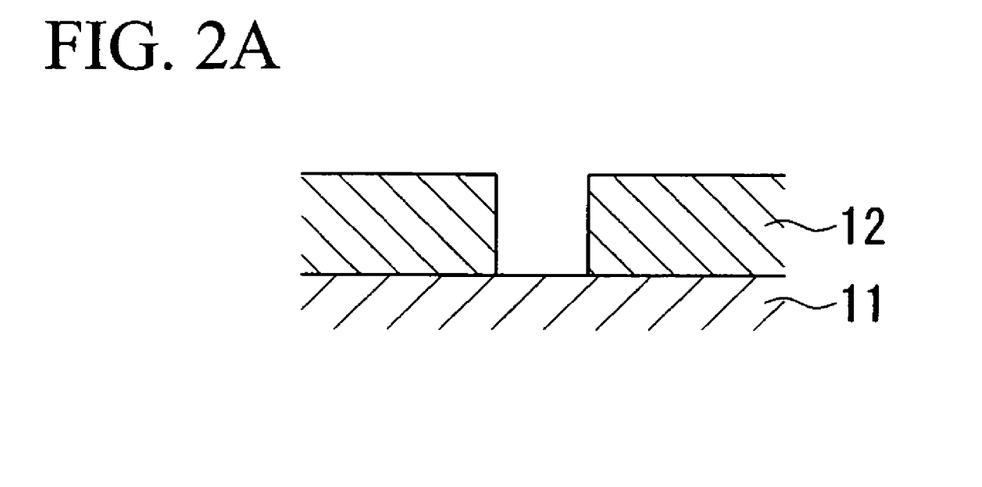
FIG. 2A through FIG. 2C are schematic illustrations describing the steps for forming a magnetic film pattern using a plating method in which a resist pattern is used as a frame.
Figure 2B:
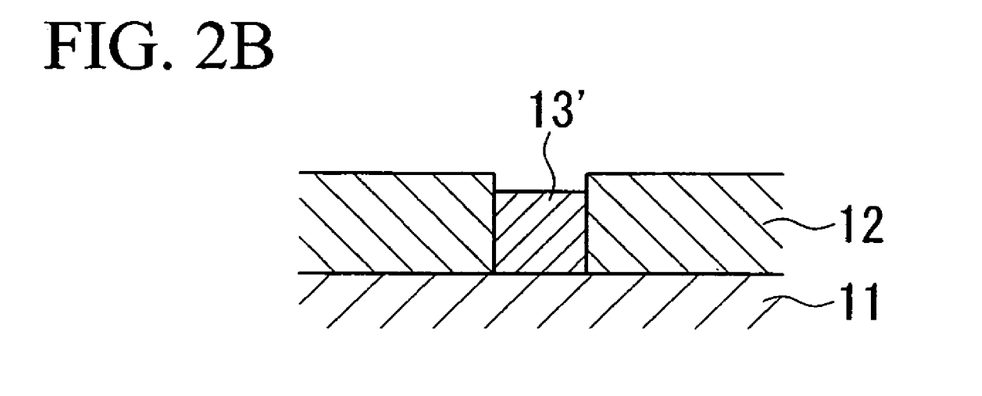
Figure 2C:
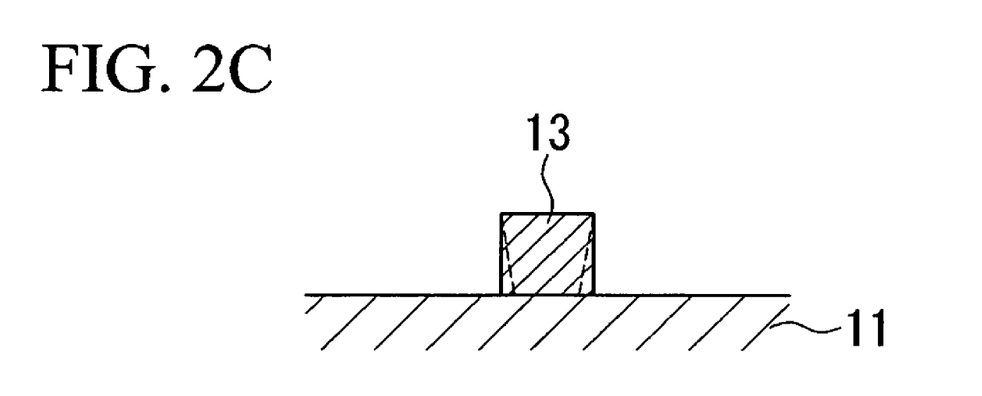

On the other hand, for the write portion (the head portion used for writing) of a magnetic head, a technique is used wherein a fine trench-like resist pattern is formed, and this resist pattern is then used as a frame to conduct plating, thereby forming a fine magnetic film pattern, as shown in FIG. 2A through FIG. 2C (side sectional views).

In other words, first, as shown in FIG. 2A, a plating seed layer 11 is formed on the upper surface of a base material (not shown in the figures), which includes a predetermined laminated structure formed on top of a substrate, and conventional lithography such as that described above is then used to form a slit-shaped resist pattern 12 with a substantially rectangular cross section on top of the plating seed layer 11.

Next, as shown in FIG. 2B, plating is conducted within the trench portion (concave portion) enclosed by the resist pattern 12, thus forming a magnetic film 13'.

Subsequently, as shown in FIG. 2C, the resist pattern 12 is removed, generating a magnetic film pattern 13 with a substantially rectangular cross section.

The patent reference 1 listed below proposes a method of forming a taper-shaped resist pattern using a non-chemically amplified novolak-based positive resist composition.

[Patent Reference 1]
Japanese Unexamined Patent Application, First Publication No. 2002-110536

In the read portion of a magnetic head, as shown in FIG. 1A through FIG. 1E, if ion milling is conducted using a pattern 5 in which the resist pattern 4 is substantially rectangular (hereafter, this type of resist pattern is also referred to as simply a "rectangular resist pattern"), then the anisotropy of the ion milling causes the printed magnetic film pattern 2 to be converted to a shape with a trapezoidal (tapered) cross section that widens with increasing proximity to the substrate 1, as shown in FIG. 1C. With this type of trapezoidal shape, that is, a trapezoidal shape in which the angle ($\theta_1$ in FIG. 1C) is large, a fine pattern cannot be produced in the magnetic film, meaning when used as the read portion of a magnetic head, the level of reading noise tends to increase. As a result, a method that enables the shape of the magnetic film to be shifted closer to a rectangular shape, that is, enables the value of $\theta_1$ to be reduced, has been keenly sought.

On the other hand, in the write portion of a magnetic head, if the magnetic film pattern 13 is a rectangular shape, then increasing the magnetic recording density is difficult, and consequently there is considerable demand for forming the side walls of the magnetic film pattern in an inverted taper shape, as shown by the dashed lines in FIG. 2C.

In the method disclosed in the patent reference 1 listed above, a non-chemically amplified resist is used, and exposure treatment is conducted with a shift in the depth width of focus, thereby forming the resist pattern with a tapered shape. However, if this method is applied to a chemically amplified resist, then the resolution of the resist pattern is inadequate, and the depth width of focus is also inadequate, meaning a taper-shaped resist pattern cannot be stably reproduced. Accordingly, if ion milling or plating are then conducted using such a resist pattern, then a number of problems can arise, including an inability to form a fine magnetic film pattern, fluctuations in the size of the magnetic film pattern on the substrate, and fluctuations in the angle of inclination ($\theta_2'$ and $\theta_3'$ in the following description) of the side walls of the magnetic film pattern on the substrate.

DISCLOSURE OF INVENTION

The present invention takes the above problems associated with the conventional technology into consideration, with an object of providing a positive resist composition which enables the formation of a fine resist pattern, enables the angle of the taper shape within that resist pattern ($\theta_2$ and $\theta_3$ in the following description) to be controlled to a suitable angle, and enables the formation of a resist pattern with an excellent depth width of focus.

Furthermore, another object of the present invention is to provide a method of forming a magnetic film pattern that uses such a positive resist composition.

The above object can be achieved by a positive resist composition in which the light transmittance of a resist film of thickness 0.3 µm formed from the chemically amplified positive resist composition, relative to light of wavelength 248 nm, is within a range from 20 to 75%.

Furthermore, the present invention also provides a method of forming a magnetic film pattern, including the steps of forming a resist pattern, having side walls with a taper-shaped cross section, on top of a magnetic film provided on a substrate with a base film disposed therebetween, using a positive resist composition according to the present invention, and then conducting ion etching of the magnetic film using the resist pattern as a mask.

Furthermore, the present invention also provides a method of forming a magnetic film pattern, including the steps of forming a resist pattern, having side walls with a taper-shaped cross section, on top of a plating seed layer provided on a substrate, using a positive resist composition according to the present invention, and then forming a magnetic film within the concave portion enclosed by the resist pattern using a plating method.

In the following description, the phrase "resist pattern having side walls with a taper-shaped cross section" used in relation to a first mode of the present invention refers to an isolated resist pattern with a taper shape, whereas the phrase "concave portion enclosed by the resist pattern" used in relation to a second mode of the present invention refers to a trench pattern, wherein the cross-sectional shape of that trench portion is an inverted taper.

EFFECTS OF THE INVENTION

According to a positive resist composition of the present invention, a resist pattern that is fine and has a favorable taper shape, or a trench pattern that is fine and has a favorable inverted taper shape, can be obtained with a good depth width of focus.

Furthermore, according to a method of forming a magnetic film pattern of the present invention, a fine magnetic film pattern of a desired shape can be formed with good reproducibility.

BEST MODE FOR CARRYING OUT THE INVENTION

As follows is a more detailed description of the present invention, based on modes according to the present invention, including a mode in which a positive resist composition of the present invention is applied to the read portion of a magnetic head (referred to as the first mode), and a mode in which the positive resist composition is applied to the write portion of a magnetic head (referred to as the second mode).

A positive resist composition according to the present invention is a composition in which the light transmittance of a resist film of thickness 0.3 µm formed from the chemically amplified positive resist composition, relative to light of wavelength 248 nm, is within a range from 20 to 75%.

In the present invention, the light transmittance at 248 nm is measured using the conventional method described below.

Namely, first, the chemically amplified positive resist composition is applied to the surface of a quartz substrate using a spin coater, and by subsequently heating to volatilize the solvent, a resist film of thickness 0.3 µm is formed from the positive resist composition. The heating temperature during this step can be a typical temperature used for volatilizing a solvent to form a resist film. Specifically, heating at 90 to 120° C. for 60 to 90 seconds is suitable. Subsequently, using the resist film formed in this manner as a measurement sample, the light transmittance is measured. During measurement, the wavelength of the measuring apparatus is set to 248 nm. Furthermore, as the measuring apparatus, a light absorption meter such as the UV-2500PC (manufactured by Shimadzu Corporation) can be used.

FIG. 3A through FIG. 3E relate to the first mode. In other words, these drawings show schematic illustrations (side sectional views) describing each of the steps for forming a resist pattern using a positive resist composition according to the present invention, and then using this resist pattern for conducting ion etching of a magnetic film. Details relating to the methods used for forming the resist pattern and conducting the ion etching and the like are described below, but basically in this mode, if the generated resist pattern is an appropriate taper shape (a taper-shaped isolated pattern), and ion etching is then conducted using this pattern as a mask, then the magnetic film pattern is formed with a desirable shape that is closer to being rectangular than conventional taper shapes (although is not completely rectangular).

FIG. 4A through FIG. 4D relate to the second mode. In other words, these drawings show schematic illustrations (side sectional views) describing each of the steps for forming a resist pattern using a positive resist composition according to the present invention, and then using a plating method to form a magnetic film within the concave portion enclosed by the resist pattern, namely the trench portion. Details relating to the methods used for forming the resist pattern and forming the magnetic film and the like are described below, but basically in this mode, if the generated resist pattern is an appropriate taper shape (in which the hollow portion of the trench pattern is an inverted taper shape), and plating is then conducted using this pattern as a frame, then the produced magnetic film pattern is formed with an appropriate inverted taper shape.

Figure 3A:
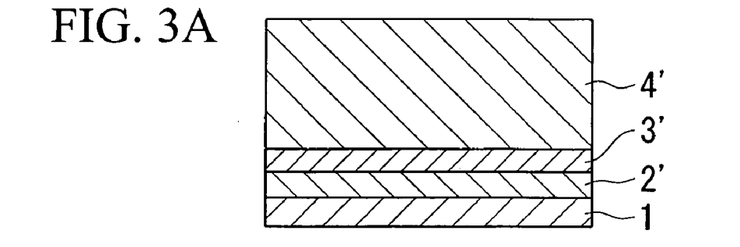
FIG. 3A through FIG. 3E are schematic illustrations describing the steps for forming a magnetic film pattern using an ion etching method that uses a taper-shaped resist pattern formed using a positive resist composition according to the present invention.
Figure 3B:
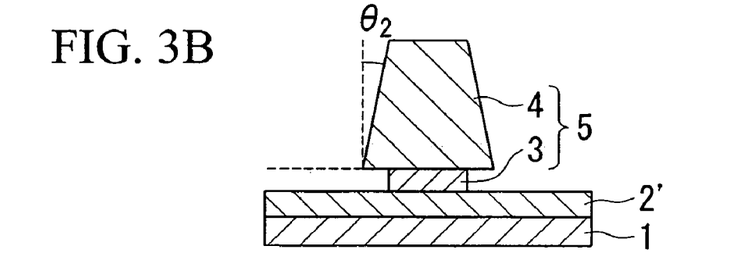

A positive resist composition according to the present invention forms a resist film of thickness 0.3 µm with a transmittance relative to light of wavelength 248 nm that falls within a range from 20 to 75%, meaning the composition exhibits strong absorption of 248 nm radiation, and as a result, if a resist film 4', 12' formed using the resist composition is subjected to selective exposure with a KrF excimer laser (248 nm), through a desired mask pattern, then the resist film 4', 12' partially absorbs the light from the exposure source. Accordingly, the lower sections of the resist film 4', 12' positioned the farthest distance from the light source are the least affected by the exposure, meaning when alkali developing is conducted, the side walls within the cross-sectional shape of the resist pattern 4, 12 form a taper shape that widens with increasing proximity to the substrate 1, as shown in FIG. 3B and FIG. 4B. In the case of the trench pattern within the resist pattern 12, the side walls within the cross-sectional shape of the trench portion form an inverted taper shape that narrows with increasing proximity to the substrate 1.

A positive resist composition of the present invention can be used at any film thickness within a range from 0.05 to 3.0 µm, and preferably from 0.1 to 1.5 µm.

Figure 3C:
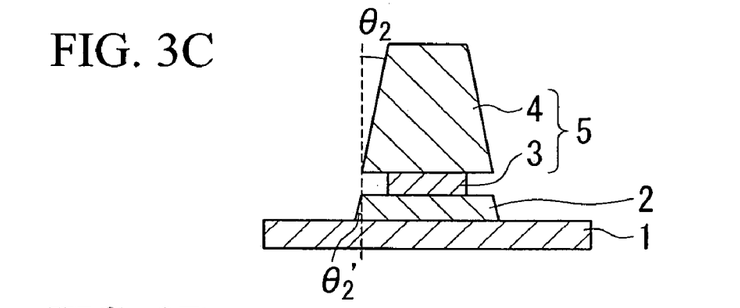

In the first mode, as described above, the side walls of the resist pattern 4 form a taper shape, and if ion milling is then conducted using the pattern 5, which represents a combination of the taper shape and the base film pattern 3 (hereafter, this combination pattern may also be referred to as simply the "taper-shaped pattern"), then the anisotropy of the ion milling can be controlled, meaning a magnetic film pattern 2 such as that shown in FIG. 3C, in which the cross section is substantially rectangular, can be obtained. In other words, the angle $\theta_2'$ in FIG. 3C is smaller than the angle $\theta_1$ in FIG. 1C (although $\theta_2'$ is not 90°), enabling a magnetic film pattern 2 of favorable shape to be obtained. Because this type of magnetic film pattern 2 can be formed, the density of GMR elements on the magnetic head or the like can be increased, and the occurrence of problems associated with the properties of the elements such as reading noise and signal failure can also be reduced, both of which are very desirable.

Figure 4A:
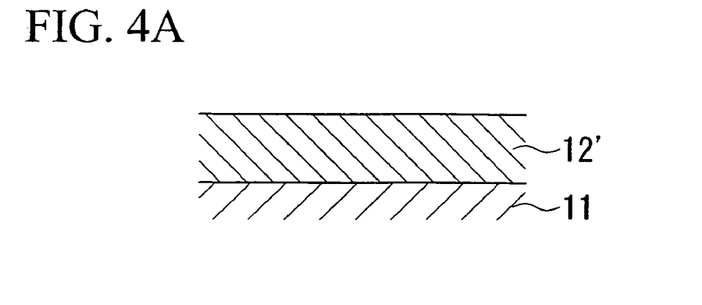
FIG. 4A through FIG. 4D are schematic illustrations describing the steps for forming a magnetic film pattern using a plating method that uses a taper-shaped resist pattern formed using a positive resist composition according to the present invention.
Figure 4B:
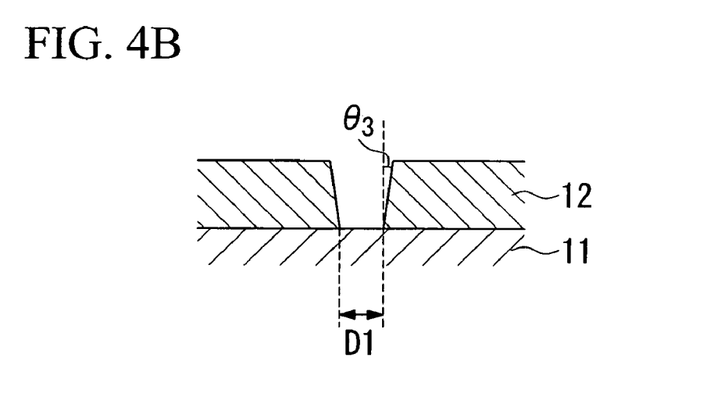
Figure 4C:
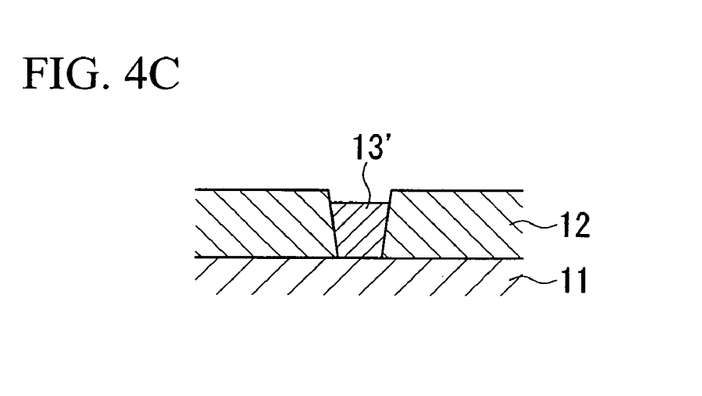
Figure 4D:
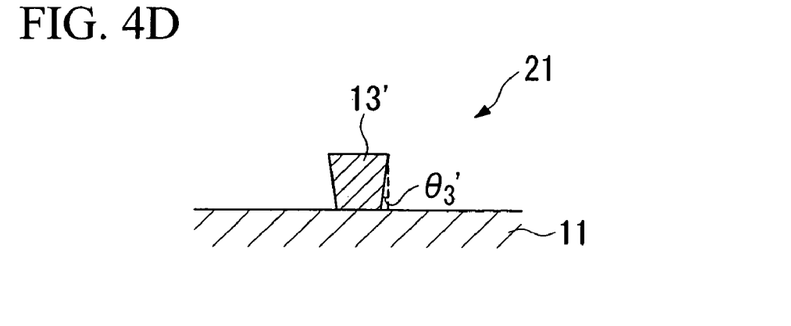

Furthermore, in the second mode, the side walls of the resist pattern 12 form a taper shape (in which the space inside the trench pattern is an inverted taper), and by conducting plating into the concave portion enclosed by this resist pattern 12, the side walls of the magnetic film 13' are formed as an inverted taper shape, as shown in FIG. 4C. In other words, as shown in FIG. 4D, an inverted taper-shaped magnetic film pattern 13 that narrows with increasing proximity to the substrate can be favorably formed.

According to a magnetic head equipped with a write portion formed by this type of magnetic film pattern 13, the shape of the magnetic film pattern written onto the recording medium (hard disk) will be an inverted taper, meaning overlap of the magnetic data can be prevented when data is written concentrically onto the disk, and as a result, data can be written more densely, and reading noise can also be reduced. Accordingly, a higher density, higher recording capacity hard disk can be produced.

[Positive Resist Composition]

In the first mode, in order to ensure the formation of a taper-shaped resist pattern with a suitable taper angle, the positive resist composition, when formed into a resist film of thickness 0.3 µm, preferably exhibits a light transmittance at 248 nm of 20 to 60%, with values from 35 to 45% being even more desirable.

As shown in FIG. 3B, the angle $\theta_2$ between a line perpendicular to the bottom surface of the resist pattern 4, and the side wall of the resist pattern 4 is referred to as the taper angle. In the first mode, by using a resist composition with a light transmittance of 20 to 60%, the taper angle of the resist pattern can be controlled within a range from 3 to 20°. By using a resist pattern in which the taper angle is preferably within a range from 5 to 15°, and even more preferably from 6 to 12°, and most preferably from 7 to 9°, ion etching does not cause the printed magnetic film pattern 2 to be converted to a shape with a trapezoidal cross section that widens considerably with increasing proximity to the substrate 1, as shown in FIG. 1C, but rather, enables the formation of a magnetic film pattern shape such as that shown in FIG. 3C (which is close to rectangular), meaning a favorable magnetic film pattern with a suitable taper shape can be obtained. The expression describing the shape as "close to rectangular" means $\theta_2'$ satisfies the formula $0°<\theta_2'<\theta_1$. In the case of a perfectly rectangular shape $\theta_2'$ is 0°, but this case is not desirable as there is a danger that it may cause signal failure within the magnetic head.

In the second mode, in order to ensure the formation of a taper-shaped resist pattern with a suitable taper angle, the positive resist composition, when formed into a resist film of thickness 0.3 µm, preferably exhibits a light transmittance at 248 nm of 20 to 75%, with values from 40 to 65% being even more desirable.

As shown in FIG. 4B, the angle $\theta_3$ between a line perpendicular to the bottom surface of the resist pattern 12, and the side wall of the resist pattern 12 is referred to as the taper angle. In the second mode, by using a resist composition with a light transmittance of 20 to 75%, the taper angle of the resist pattern can be controlled within a range from 1 to 30°. In this second mode, by using a taper angle that is preferably within a range from 1 to 20°, and even more preferably from 2 to 15°, and most preferably from 3 to 10°, and then forming a magnetic film 13' by conducting plating within the concave portion enclosed by the resist pattern having this taper angle, a favorable magnetic film pattern 13 with a suitable inverted taper shape, such as that shown in FIG. 4D, can be obtained.

To ensure that a positive resist composition of the present invention exhibits absorption at 248 nm, the resist composition may be any composition that incorporates a material (hereafter referred to as the component (A)) that exhibits absorption at 248 nm.

In the present invention, the term "exhibits absorption" means that when the composition is prepared by blending or the like, and then used to form a resist film of thickness 0.3 µm, the light transmittance of that resist film at 248 nm falls within a range from 20 to 75%. If the material exhibits a high level of absorption, then only a small quantity need be added to the composition, whereas if the material exhibits a low level of absorption, then a sufficiently large quantity must be added to achieve the objects of the present invention.

[(A) Material that Exhibits Absorption at 248 nm]

In a positive resist composition according to the present invention, there are no particular restrictions on the component (A), provided it exhibits absorption at 248 nm, and suitable examples include low molecular weight compounds such as dyes, and high molecular weight compounds such as resins. More specific examples include the materials listed below.

(a1) Materials containing an anthracene ring as a partial structure (hereafter referred to as (a1)).

(a2) Materials containing a benzene ring as a partial structure (hereafter referred to as (a2)).

(a3) Materials containing a naphthalene ring as a partial structure (hereafter referred to as (a3)).

(a4) Materials containing biphenyl as a partial structure (hereafter referred to as (a4)).

The material (a1) may be any compound that contains an anthracene ring as a partial structure. Examples of such materials include dyes and the like such as anthracenemethanol, anthraceneethanol, anthracenecarboxylic acid, anthracene, methylanthracene, dimethylanthracene, and hydroxyanthracene and the like.

Of these, anthracenemethanol is particularly preferred, as it enables ready control of the taper angle within the resist pattern.

The material (a2) may be any compound that contains a benzene ring as a partial structure. Examples of such materials include benzene, alkylbenzenes such as methylbenzene and ethylbenzene, benzyl alcohol, cyclohexylbenzene, benzoic acid, salicylic acid, dyes such as anisole, and resins such as novolak resins.

These novolak resins can be obtained by an addition condensation of an aromatic material with a phenolic hydroxyl group (hereafter, simply referred to as a phenol compound) and an aldehyde, in the presence of an acid catalyst.

Examples of the phenol used include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, p-phenylphenol, resorcinol, hydroquinone, hydroquinone monomethyl ether, pyrogallol, phloroglucinol, hydroxydiphenyl, bisphenol A, gallic acid, gallic esters, α-naphthol, and β-naphthol.

Furthermore, examples of the aldehyde include formaldehyde, furfural, benzaldehyde, nitrobenzaldehyde, and acetaldehyde.

There are no particular restrictions on the catalyst used during the addition condensation reaction, and suitable acid catalysts include hydrochloric acid, nitric acid, sulfuric acid, formic acid, oxalic acid, and acetic acid.

The weight average molecular weight (the polystyrene equivalent value, this also applies below) of the novolak resin is preferably within a range from 1,000 to 30,000.

The material (a3) may be any compound that contains a naphthalene ring as a partial structure. Examples of such materials include dyes and the like such as naphthalene, methylnaphthalene, dimethylnaphthalene, ethylnaphthalene, 1-naphthol, 2-naphthol, naphthalenediol, and naphthalenetriol.

The material (a4) may be any compound that contains biphenyl as a partial structure. Examples of such materials include dyes and the like such as biphenyl, dimethylbiphenyl, biphenylol, biphenyldiol, and biphenyltetraol.

As the component (A), either a single material, or a combination of two or more different materials can be used.

Of these materials, compounds (a1) that contain an anthracene ring as a partial structure are preferred in terms of achieving the desired light transmittance, and of the (a1) materials, anthracenemethanol is particularly preferred, as it offers a superior sensitivity margin and depth width of focus.

There are no particular restrictions on the quantity used of the component (A), which can be adjusted in accordance with the level of absorption of the component (A).

In a resist composition of the present invention, the quantity added of the component (A) can be used to alter the taper angle of the resist pattern, thus controlling the shape of the magnetic film pattern.

In the present invention, a sufficient quantity of the component (A) should be added so that when a resist film of thickness 0.3 µm is formed, the light transmittance of that resist film at 248 nm falls within a range from 20 to 75%, and typically, a quantity of 0.01 to 20 parts by weight per 100 parts by weight of the component (B) is preferred, with quantities from 0.2 to 8.0 parts by weight being even more desirable.

In the first mode, the quantity used of the component (A) preferably falls within a range from 1 to 20 parts by weight, and even more preferably from 2 to 8 parts by weight, per 100 parts by weight of the component (B), as such a quantity enables a suitable level of absorption to be achieved, thereby enabling production of a resist pattern with a favorable taper shape.

In the second mode, the quantity used of the component (A) preferably falls within a range from 0.01 to 20 parts by weight, and even more preferably from 0.01 to 5 parts by weight, per 100 parts by weight of the component (B), as such a quantity enables a suitable level of absorption to be achieved, thereby enabling production of a resist pattern with a favorable taper shape.

If the quantity used of the component (A) exceeds 20 parts by weight per 100 parts by weight of the component (B), then the level of absorption of the resist composition at 248 nm must decrease excessively, increasing the danger that a favorable resist pattern cannot be formed.

There are no particular restrictions on the positive resist composition containing the component (A), although a chemically amplified positive resist composition containing the material (A) that exhibits absorption at 248 nm, a resin component (B), which contains an acid dissociable, dissolution inhibiting group, and exhibits increased alkali solubility in the presence of acid, an acid generator component (C) that generates acid on exposure, and an organic solvent (D) that is capable of dissolving the component (A), component (B) and component (C) provides superior resist pattern resolution and enables ready formation of the taper shape, and is consequently preferred.

In such a positive resist composition, the action of the acid generated by the component (C) causes the acid dissociable, dissolution inhibiting groups contained within the component (B) to dissociate, causing the entire component (B) to change from an alkali insoluble state to an alkali soluble state.

As a result, when the positive resist composition is applied to a substrate and then selectively exposed through a mask during resist pattern formation, the alkali solubility of the exposed portions increases, enabling alkali developing to be conducted.

As the positive resist composition according to the present invention, a resist composition produced by adding the component (A) to any of the KrF positive resist compositions proposed as suitable resist materials for methods in which exposure is conducted using a KrF excimer laser can be favorably used.

Preparation of a positive resist composition according to the present invention may be conducted, for example, by simply mixing and stirring together each of the components described below using normal methods, or if necessary, by dispersing and mixing the components using a dispersion device such as a dissolver, a homogenizer, or a three roll mill. Furthermore, following mixing of the components, the composition may also be filtered using a mesh or a membrane filter or the like.

[Resin Component (B)]

There are no particular restrictions on the component (B) used in the present invention, provided it is a material used as the resin within conventional positive resist compositions, although a resin containing a plurality of different structural units, including a structural unit derived from hydroxystyrene and a structural unit containing an acid dissociable, dissolution inhibiting group, is preferred.

Resins containing a combination of the units described below are particularly preferred as they provide superior resolution of the resist pattern, ready formation of the taper shape, and excellent depth width of focus.

(b1) Structural units derived from hydroxystyrene (hereafter referred to as (b1) units).

(b2) Structural units derived from styrene (hereafter referred to as (b2) units).

(b3) Structural units derived from a (meth)acrylate ester containing an acid dissociable, dissolution inhibiting group (hereafter referred to as (b3) units).

A component (B) that includes (b1), (b2), and (b3) units, or (b1) and (b3) units, is also preferred in terms of ion milling resistance and heat resistance.

The term "(meth)acrylate" refers to either one of, or both, methacrylate and acrylate. The term "structural unit" refers to a monomer unit that contributes to the formation of a polymer.

Examples of the (b1) unit include structural units derived by cleavage of the ethylenic double bond of the hydroxystyrene in hydroxystyrenes such as p-hydroxystyrene, and α-alkylhydroxystyrenes such as α-methylhydroxystyrene and α-ethylhydroxystyrene. Of these, units derived from p-hydroxystyrene and α-methylhydroxystyrene are particularly preferred.

Examples of the (b2) unit include structural units derived by cleavage of the ethylenic double bond of either styrene, or a styrene containing a halogen atom or alkyl group substituent such as chlorostyrene, chloromethylstyrene, vinyltoluene, and α-methylstyrene. Of these, units derived from styrene are particularly preferred.

The (b3) unit is a structural unit derived from a (meth)acrylate ester containing an acid dissociable, dissolution inhibiting group.

There are no particular restrictions on the acid dissociable, dissolution inhibiting group within the (b3) unit, and any group can be used provided it exhibits an alkali dissolution inhibiting effect that renders the entire component (B) alkali insoluble prior to exposure, but dissociates under the action of acid generated from the component (C) following exposure, causing the entire component (B) to become alkali soluble. Generally, groups which form a cyclic or chain-like tertiary alkyl ester with the carboxyl group of (meth)acrylic acid, tertiary alkoxycarbonylalkyl groups, or chain-like or cyclic alkoxyalkyl groups and the like are the most widely used. Specific examples of such acid dissociable, dissolution inhibiting groups include branched, monocyclic, or polycyclic tertiary alkyl groups such as tert-butyl groups, tert-pentyl groups, 1-methylcyclopentyl groups, 1-ethylcyclopentyl groups, 1-methylcyclohexyl groups, 1-ethylcyclohexyl groups, 2-methyl-2-adamntyl groups, and 2-ethyl-2-adamantyl groups, chain-like alkoxyalkyl groups such as 1-ethoxyethyl groups and 1-methoxypropyl groups, cyclic alkoxyalkyl groups such as tetrahydrofuranyl groups and tetrahydropyranyl groups, and tertiary alkoxycarbonylalkyl groups such as tert-butoxycarbonylmethyl groups and tert-butoxycarbonylethyl groups, and of these, tertiary alkyl groups are preferred, with tert-butyl groups being particularly desirable.

If the positive resist composition of the present invention includes a component (B), then components in which the (b1) units account for 50 to 80 mol %, and preferably from 60 to 70 mol %, of the combined total of all the structural units that constitute the component (B) offer superior alkali developability, and are consequently preferred.

Furthermore, components in which the (b2) units account for 0 to 35 mol %, and preferably from 5 to 35 mol %, of the combined total of all the structural units that constitute the component (B) exhibit excellent pattern shape with no thickness loss, and are consequently preferred.

Furthermore, components in which the (b3) units account for 5 to 40 mol %, and preferably from 8 to 25 mol %, of the combined total of all the structural units that constitute the component (B) exhibit excellent resolution, and are consequently preferred.

There are no particular restrictions on the weight average molecular weight (the polystyrene equivalent value, this also applies below) of the resin component (B), although typical values are within a range from 3,000 to 50,000, with values from 4,000 to 30,000 being preferred. If the weight average molecular weight exceeds this range, then the solubility of the component within the resist solvent deteriorates, whereas if the value is too small, there is a danger of thickness loss within the resist pattern.

[Acid Generator Component (C)]

As the acid generator component (C), any of the materials typically used as acid generators in conventional chemically amplified resists can be used.

Of these acid generators, onium salts with a fluorinated alkylsulfonate ion as the anion are preferred. Examples of preferred acid generators include onium salts such as diphenyliodonium trifluoromethanesulfonate, heptafluoropropanesulfonate or nonafluorobutanesulfonate, bis(4-tert-butylphenyl)iodonium trifluoromethanesulfonate, heptafluoropropanesulfonate or nonafluorobutanesulfonate, (4-methoxyphenyl)phenyliodonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, triphenylsulfonium trifluoromethanesulfonate, heptafluoropropanesulfonate or nonafluorobutanesulfonate, (4-methoxyphenyl)diphenylsulfonium trifluoromethanesulfonate, heptafluoropropanesulfonate or nonafluorobutanesulfonate, (p-tert-butylphenyl)diphenylsulfonium trifluoromethanesulfonate, heptafluoropropanesulfonate or nonafluorobutanesulfonate, tri(p-tert-butylphenyl)sulfonium trifluoromethanesulfonate, heptafluoropropanesulfonate or nonafluorobutanesulfonate, and (4-trifluoromethylphenyl)diphenylsulfonium trifluoromethanesulfonate, heptafluoropropanesulfonate or nonafluorobutanesulfonate.

As the component (C), either a single acid generator, or a combination of two or more different acid generators can be used.

The quantity used of the component (C) is typically within a range from 0.5 to 30 parts by weight, and preferably from 1 to 10 parts by weight, per 100 parts by weight of the component (B). If the quantity is less than 0.5 parts by weight, then pattern formation may not progress satisfactorily, whereas if the quantity exceeds 30 parts by weight, it becomes difficult to achieve a uniform solution, and there is also a danger of a deterioration in the storage stability of the composition.

[Organic Solvent (D)]

A positive resist composition according to the present invention can be produced by dissolving the aforementioned component (A), component (B) and component (C), together with an optional component (E) and/or component (F) described below, in an organic solvent (D).

The organic solvent (D) may be any solvent capable of dissolving the component (A), the component (B), and the component (C) to generate a uniform solution, and one or more solvents selected from known materials used as the solvents for conventional chemically amplified resists can be used.

Specific examples of the organic solvent (D) include ketones such as acetone, methyl ethyl ketone, cyclohexanone, methyl isoamyl ketone and 2-heptanone, polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate, cyclic ethers such as dioxane, and esters such as methyl lactate, ethyl lactate (EL), methyl acetate, ethyl acetate, butyl acetate, methyl pyruvate, ethyl pyruvate, methyl methoxypropionate, and ethyl ethoxypropionate. These organic solvents can be used alone, or as a mixed solvent containing two or more different solvents.

The quantity of the organic solvent (D) is generally sufficient to produce a solid fraction concentration within the positive resist composition of 3 to 30% by weight, with the actual quantity selected in accordance with the resist film thickness.

[Other Components]

Furthermore, in a positive resist composition according to the present invention, in order to improve properties such as the resist pattern shape and the long term stability (the post exposure stability of the latent image formed by the patternwise exposure of the resist layer), a known amine, and preferably a secondary lower aliphatic amine or a tertiary lower aliphatic amine, can also be added as an optional component (E).

Here, a lower aliphatic amine refers to an alkyl or alkyl alcohol amine of no more than 5 carbon atoms, and examples of these secondary and tertiary amines include trimethylamine, diethylamine, triethylamine, di-n-propylamine, tri-n-propylamine, tripentylamine, diethanolamine, triethanolamine and triisopropanolamine, and alkanolamines such as triethanolamine are particularly preferred. These may be used alone, or in combinations of two or more different compounds. This amine is typically added in a quantity within a range from 0.01 to 5.0 parts by weight per 100 parts by weight of the component (B).

In order to prevent any deterioration in sensitivity caused by the addition of the aforementioned component (E), and improve the substrate dependency characteristics, an organic carboxylic acid, or a phosphorus oxo acid or derivative thereof can also be added as another optional component (F). The component (E) and the component (F) can be used in combination, or either one may also be used alone.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (F) is typically used in a quantity within a range from 0.01 to 5.0 parts by weight per 100 parts by weight of the component (A).

Miscible additives can also be added to a positive resist composition according to need, including additive resins for improving the properties of the resist film, surfactants for improving the ease of application, dissolution inhibitors, plasticizers, stabilizers, colorants and halation prevention agents.

[Method of Forming Resist Pattern (First Mode)]

Next is a description of a method of forming a resist pattern using a positive resist composition according to the present invention.

In the first mode, the resist composition of the present invention is used for forming a resist pattern for ion etching, wherein the film to be etched is a magnetic film. Examples of ion etching include anisotropic etching such as ion milling.

FIG. 3A through FIG. 3E show schematic illustrations (side sectional views) of each of the steps for resist pattern formation and ion etching using a positive resist composition according to the first mode.

First, as shown in FIG. 3A, a magnetic film 2' is formed on top of a substrate 1 such as a silicon wafer using a sputtering apparatus. Examples of the magnetic material used in the magnetic film 2' include materials containing elements such as Ni, Co, Cr, and Pt. Subsequently, a coating liquid for forming a base film that is soluble in an alkali developing solution, for example, polymethylglutarimide manufactured by Shipley Co., Ltd. (hereafter abbreviated as PMGI), is applied to the surface of the formed magnetic film 2' using a spin coater, and is then dried to form a base layer film 3'.

Subsequently, a solution of a resist composition prepared in the manner described above is applied to the surface of the base layer film 3' using a spinner or the like, and is then prebaked (PAB treatment), forming a resist film 4'. The prebake conditions vary depending on factors such as the nature of each of the components within the composition, the respective blend proportions, and the thickness of the applied film, although typical conditions include a temperature of 70 to 150° C., and preferably from 80 to 140° C., for a period of 0.5 to 60 minutes. From the viewpoint of controlling the taper shape, the film thickness of the formed resist film 4' is preferably within a range from 0.05 to 1.0 μm, and most preferably from 0.1 to 0.5 μm.

The resist film 4' is then subjected to selective exposure through a desired mask pattern. Because the positive resist composition according to the present invention exhibits absorption at 248 nm, a KrF excimer laser can be favorably used as the exposure wavelength.

Following completion of the exposure step, PEB (post exposure baking) is conducted, and by then carrying out developing treatment using an alkali developing solution formed from an aqueous alkali solution, predetermined areas (the exposed portions) of the resist film 4' are developed and removed, thereby forming a resist pattern (isolated pattern) 4 with a taper shape, as shown in FIG. 3B. During developing, those portions of the base film 3' positioned beneath the portions of the resist film 4' that undergo alkali developing are also removed by the alkali developing solution, but because the base film 3' has a higher level of alkali solubility than the resist film 4', following alkali developing, the base film 3' positioned beneath the portions of the formed resist pattern 4 remains only within the vicinity of the center of the pattern 4. As a result, a lift-off pattern 5 such as that shown in FIG. 3B, which includes a base film 3' pattern 3 of narrow width, and a resist pattern 4 of the resist film 4' of greater width and formed in a taper shape, is obtained.

[Production of Magnetic Head (First Mode)]

Next is a description of a method of producing the read portion of a magnetic head, using the taper-shaped resist pattern obtained in the manner described above.

When ion milling is conducted using the pattern 5, which includes the taper-shaped resist pattern 4 and the base layer pattern 3 shown in FIG. 3B, as a mask, then as shown in FIG. 3C, the magnetic film 2' surrounding the pattern 5 is etched away, leaving the magnetic film 2 positioned beneath the pattern 5, and the resulting magnetic film pattern 2 is printed with a shape that is close to being rectangular ($0°<\theta_2'<\theta_1$). The ion milling can be conducted using conventional methods, using, for example, an IML series ion beam milling apparatus manufactured by Hitachi Ltd.

Figure 3D:
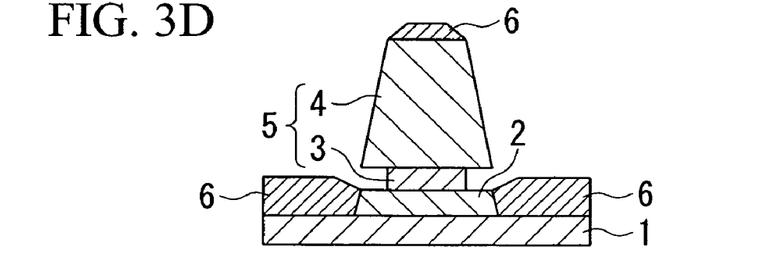
Figure 3E:
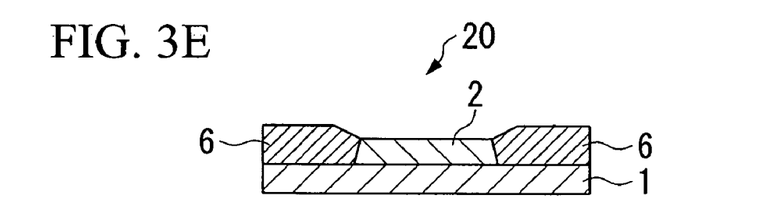

If sputtering is then conducted, then as shown in FIG. 3D, an electrode film 6 is formed on top of the pattern 5, and on top of the substrate 1 in the vicinity surrounding the magnetic film pattern 2. The sputtering can be conducted using conventional methods, using, for example, an ISM-2200 or ISP-1801 sputtering apparatus manufactured by Hitachi Ltd. At the time of sputtering, because the magnetic film pattern has been formed so that $0°<\theta_2'<\theta_1$, the region of contact with the electrode film 6 is smaller than in conventional methods, meaning the level of reading noise is reduced, and because the value of $\theta_2'$ is not 0°, which would mean a perfectly rectangular magnetic film pattern, the danger of signal failure and the like can also be reduced. Finally, by using an alkali developing solution to dissolve the base layer film pattern 3, thereby removing the pattern 5, a read portion 20 of a magnetic head such as that shown in FIG. 3E, including the substrate 1, the nearly rectangular magnetic film pattern 2 formed on top of the substrate 1, and the electrode film 6 formed surrounding the pattern 2, is produced.

In this manner, by conducting ion etching of the magnetic film through a resist pattern formed using a positive resist composition according to the present invention, a substantially rectangular magnetic film pattern with a favorable taper shape can be formed.

By using a resist composition according to the first mode, a fine resist pattern can be formed, the angle $\theta_2$ of the taper shape (see FIG. 3B) within that resist pattern can be controlled to a suitable angle, and a resist pattern with an excellent depth width of focus can be formed. As a result, by conducting ion etching of the magnetic film through this taper-shaped resist pattern, a fine magnetic film pattern can be formed, the angle $\theta_2'$ (see FIG. 3C) of the side walls within the magnetic film pattern can be controlled to a suitable angle, and the size and angle of the magnetic film pattern can be formed with good stability.

[Method of Forming Resist Pattern (Second Mode)]

In the second mode, a resist composition of the present invention is used to form a resist pattern that is then used as a frame for forming a magnetic film by plating. As the plating method, conventional electroplating methods can be used.

FIG. 4A through FIG. 4D show schematic illustrations (side sectional views) of each of the steps for resist pattern formation and magnetic film formation using a positive resist composition according to the second mode.

First, as shown in FIG. 4A, a resist film 12' is formed on top of a plating seed layer 11, which represents the uppermost layer provided on top of a base material.

The base material can be a structure in which, for example, a magnetic film pattern constituting the read portion, a flattening film, and a shield layer are laminated, as required, on top of a substrate 1 such as a silicon wafer, and the plating seed layer 11 is then formed as the uppermost layer. The plating seed layer 11 performs the role of an electrode during the electroplating process, and is formed from a material with good conductivity. As the material for the plating seed layer 11, one or more materials selected from Fe, Co, and Ni and the like can be used. As the plating seed layer 11, a material containing the same components as the film formed by the plating process is usually used.

The resist film 12' can be formed by applying a solution of a resist composition prepared in the manner described above to the surface of the plating seed layer 11 using a spinner or the like, and then conducting prebaking (PAB treatment). The prebake conditions vary depending on factors such as the nature of each of the components within the composition, the respective blend proportions, and the thickness of the applied film, although typical conditions include a temperature of 70 to 150° C., and preferably from 80 to 140° C. for a period of 0.5 to 60 minutes. The film thickness of the generated resist film 12' can be determined in accordance with the thickness (height) required for the magnetic film pattern 13, but is preferably within a range from 0.1 to 3.0 μm, and most preferably from 0.2 to 2.0 μm.

The resist film 12' is then subjected to selective exposure through a desired mask pattern. Because the positive resist composition according to the present invention exhibits absorption at 248 nm, a KrF excimer laser can be favorably used as the exposure wavelength.

Following completion of the exposure step, PEB (post exposure baking) is conducted, and by then carrying out developing treatment using an alkali developing solution formed from an aqueous alkali solution, predetermined areas (the exposed portions) of the resist film 12' are developed and removed, thereby forming a resist pattern 12 with taper-shaped side walls providing a trench pattern, as shown in FIG. 4B.

There are no particular restrictions on the cross-sectional spacing between sections of the resist pattern 12, although the distance D1 at the bottom surface of the resist pattern 12 is typically no more than 250 nm, and preferably within a range from 100 to 200 nm.

[Production of Magnetic Head (Second Mode)]

Next is a description of a method of producing the write portion of a magnetic head, using a resist pattern 12 with taper-shaped side walls obtained in the manner described above.

As shown in FIG. 4C, electroplating is conducted within the concave portion enclosed by the resist pattern 12 with taper-shaped side walls, thereby forming a magnetic film 13'.

Examples of the magnetic material used in the magnetic film 13' include materials containing elements such as Ni, Co, Cr, and Pt.

The electroplating can be conducted using normal methods. For example, a method can be used in which the plating seed layer 11 is energized while the substrate structure is immersed in an electrolyte containing ions of the magnetic material.

Following formation of the magnetic film 13', by removing the resist pattern 12, a magnetic head write section 21 in which the magnetic film pattern 13 is formed with an inverted taper shape is produced, as shown in FIG. 4D. There are no particular restrictions on the method used for removing the resist pattern 12, provided the method has no deleterious effects on the magnetic film, and suitable methods include conventional methods that use either a stripping solution or oxygen plasma ashing.

In this manner, by forming the magnetic film using a resist pattern formed from a positive resist composition of the present invention as a frame, a magnetic film pattern with a favorable inverted taper shape can be formed.

By using a resist composition according to the second mode, a fine resist pattern can be formed, the angle $\theta_3$ of the taper shape (see FIG. 4B) within that resist pattern can be controlled to a suitable angle, and a resist pattern with an excellent depth width of focus can be formed. As a result, by forming a magnetic film by a plating method, using the taper-shaped resist pattern as a frame, a fine magnetic film pattern can be formed, the angle $\theta_3'$ (see FIG. 4D) of the side walls within the magnetic film pattern can be controlled to a suitable angle, and the size and angle of the magnetic film pattern can be formed with good stability.

This description has focused on the production of magnetic heads, but a positive resist composition according to the present invention can also be used favorably in the production of MRAM (Magnetic Random Access Memory), and MEMS (Micro Electro Mechanical Systems) and the like.

EXAMPLES

As follows is a description of examples of the present invention, although the scope of the present invention is in no way restricted by the examples presented below.

Examples 1 to 4 (First Mode), Comparative Example 1

<Preparation of Positive Resist Compositions>

By altering the quantity of the component (A), 5 different positive resist compositions of the examples 1 to 4 and the comparative example 1 were prepared in the manner described below.

Namely, the component (A), the component (B), the component (C), the component (E), and any other components were dissolved uniformly in the component (D), yielding a positive resist composition.

As the component (A), anthracenemethanol, as shown below in [formula 1], was used. In the examples 1 to 4, the blend quantity of the component (A) was altered in a stepwise manner, by using 4.0, 4.5, 5.0, and 5.5 parts by weight respectively per 100 parts by weight of the component (B). In the comparative example 1, no component (A) was added.

As the component (B), 100 parts by weight of a copolymer containing the three structural units shown below in [formula 2] was used. The proportions of each of the structural units p, q, and r used in the preparation of the component (B) were p=61.2 mol %, q=28.8 mol %, and r=10.0 mol % respectively. The weight average molecular weight of the prepared component (B) was 12,000.

As the component (C), 3.0 parts by weight triphenylsulfonium trifluoromethanesulfonate was used per 100 parts by weight of the component (B).

As the component (D), 900 parts by weight of propylene glycol monomethyl ether acetate was used per 100 parts by weight of the component (B).

As the component (E), 0.35 parts by weight of triethanolamine was used.

As the component (F), 0.32 parts by weight of salicylic acid was used.

Each of the thus obtained positive resist compositions was then applied to the surface of a silicon wafer using a spinner, and was then prebaked and dried on a hotplate at 110° C. for 90 seconds, thus forming a resist film with a film thickness of 300 nm.

Subsequently, this resist film was selectively exposed with a KrF excimer laser (248 nm), using a KrF exposure apparatus EPA-3000EX3 (manufactured by Canon Inc., NA (numerical aperture)=0.60, σ=0.65).

PEB treatment was then conducted at 100° C. for 90 seconds, and subsequent development for 60 seconds in an alkali developing solution yielded an isolated line resist pattern. As the alkali developing solution, a 2.38% by weight aqueous solution of tetramethylammonium hydroxide was used.

Of the resist films obtained in the above manner, resist films of thickness 0.3 μm formed using the resist compositions according to the examples 1 and 2, and the comparative example 1 were measured to determine their transmittance at 248 nm. Measurement of the transmittance was conducted using a UV-2500 PC apparatus (manufactured by Shimadzu Corporation). The results are shown below in Table 1.

TABLE 1

| | Component (A) quantity (parts by weight) | Transmittance at 248 nm for resist film of thickness 0.3 μm (%) |
| --- | --- | --- |
| Example 1 | 4.0 | 43.9 |
| Example 2 | 4.5 | 39.8 |
| Comparative example 1 | 0 | 78.4 |

Furthermore, inspection of the isolated line resist patterns obtained in the manner described above revealed that the resist patterns formed using the resist compositions of the examples 1 to 4, containing an added component (A), exhibited favorable taper shapes in which the side walls of the isolated line pattern had a suitable taper angle ($\theta_2$), as shown below in Table 2. In contrast, the isolated line resist pattern formed using the resist composition of the comparative example 1, which contained no added component (A), was a conventional rectangular-shaped pattern.

Furthermore, the resolution (resist pattern size) and associated depth width of focus values for each of the examples revealed that in the example 1, an isolated line pattern of 250 nm was formed and the depth width of focus was 0.6 μm, in the example 2, an isolated line pattern of 250 nm was formed and the depth width of focus was 0.7 μm, in the example 3, an isolated line pattern of 250 nm was formed and the depth width of focus was 0.6 μm, and in the example 4, an isolated line pattern of 250 nm was formed and the depth width of focus was 0.5 μm. Because the comparative example 1 does not exhibit a taper shape, the comparative example 1 was estimated as inferior, even without conducting measurements of the resolution and depth width of focus.

TABLE 2

| | Component (A) quantity (parts by weight) | Resist pattern taper angle $\theta_2$ (°) |
| --- | --- | --- |
| Example 1 | 4.0 | 6 |
| Example 2 | 4.5 | 8 |
| Example 3 | 5.0 | 10 |
| Example 4 | 5.5 | 12 |
| Comparative example 1 | 0 | 0 |

Comparative Example 2

In the example 1, the positive resist composition was replaced with a non-chemically amplified naphthoquinone-novolak type positive resist composition for use with i-line radiation, the resist film thickness was changed to 0.5 μm, and the exposure apparatus was replaced with an NSRi10D i-line stepper (manufactured by Nikon Corporation), and normal exposure and developing were then used to form an isolated line pattern. When pattern formation was then conducted while the depth width of focus was varied across the same 0.5 μm as the resist film thickness, although a suitable taper shape was obtained at the central focus point, at focus points shifted from the 0.5 μm focus, an isolated line pattern was formed with an inverted taper shape relative to the isolated pattern with a suitable taper shape, meaning the depth width of focus was inadequate, and the reproducibility of an isolated line pattern with a favorable taper shape was poor.

From the results of the examples 1 to 4 it is evident that the positive resist compositions according to the present invention, which contain the added component (A), exhibit absorption at 248 nm, and when these resist compositions were used to form isolated line resist patterns by conducting exposure with a KrF excimer laser, the patterns were of a favorable shape with the side walls displaying a suitable taper angle. Furthermore, fine isolated line patterns of 250 nm were able to be formed with a good depth width of focus.

Accordingly, if ion etching is conducted via this type of isolated line pattern, then a magnetic film of the desired shape can be produced.

Furthermore, from the results of the comparative example 1 it is evident that when an isolated line pattern was formed using a resist composition that contained no component (A), a conventional rectangular-shaped isolated line pattern was obtained. If this type of rectangular-shaped isolated line pattern is used, then the resulting magnetic film is converted to a trapezoidal cross section that widens with increasing proximity to the substrate, meaning fine processing is impossible.

Furthermore, from the results of the comparative example 2 it is clear that with a non-chemically amplified positive resist composition, the reproducibility of an isolated line pattern with a favorable taper shape is inadequate, and the depth width of focus is insufficient. If this type of isolated line pattern is used, then a fine pattern cannot be formed in the magnetic film, fluctuations occur in the magnetic film pattern size on the substrate, and fluctuations also occur in the angle of the magnetic film pattern on the substrate, meaning fine processing is impossible.

Examples 5 to 12 (Second Mode)

<Preparation of Positive Resist Compositions>

By altering the quantity of the component (A), 8 different positive resist compositions of the examples 5 to 12 were prepared in the manner described below.

Namely, positive resist compositions of the examples 5 to 12 were prepared in the same manner as the example 1, with the exception of altering the blend quantity of the component (A) in a stepwise manner, by using 0.2, 0.5, 1.0, 1.5, 2.0, 3.0, 4.0, and 4.5 parts by weight respectively per 100 parts by weight of the component (B). The positive resist compositions of the examples 11 and 12 are the same as the compositions of the aforementioned examples 1 and 2 respectively.

Each of the thus obtained positive resist compositions was then applied to the surface of a silicon wafer using a spinner, and was then prebaked and dried on a hotplate at 100° C. for 90 seconds, thus forming a resist film with a film thickness of 300 nm.

Subsequently, the resist film was selectively exposed with a KrF excimer laser (248 nm), using the same KrF exposure apparatus EPA-3000EX3 as the example 1.

PEB treatment was then conducted at 110° C. for 90 seconds, and subsequent development for 60 seconds in an alkali developing solution yielded a trench pattern in which a slit-shaped concave portion was formed enclosed by the resist pattern. As the alkali developing solution, a 2.38% by weight aqueous solution of tetramethylammonium hydroxide was used.

Resist films of thickness 0.3 µm formed using the resist compositions according to the examples 5 to 12 were measured to determine the transmittance at 248 nm. Measurement of the transmittance was conducted using the same UV-2500 PC apparatus (manufactured by Shimadzu Corporation) as the example 1. The results are shown below in Table 3.

TABLE 3

|  | Component (A) quantity (parts by weight) | Transmittance at 248 nm for resist film of thickness 0.3 µm (%) |
|---|---|---|
| Example 5 | 0.2 | 74.1 |
| Example 6 | 0.5 | 72.3 |
| Example 7 | 1.0 | 67.8 |
| Example 8 | 1.5 | 63.9 |
| Example 9 | 2.0 | 59.1 |
| Example 10 | 3.0 | 50.3 |
| Example 11 | 4.0 | 43.9 |
| Example 12 | 4.5 | 39.8 |

Inspection of the trench patterns obtained in the manner described above revealed that the resist patterns exhibited favorable taper shapes in which the side walls had a suitable taper angle ($\theta_3$), as shown below in Table 4.

Furthermore, in terms of the resolution (resist pattern size) and associated depth width of focus values for each of the examples, in the example 5, a trench pattern was formed in which the distance D1 between resist pattern portions at the bottom surface of the resist pattern was 200 nm, and the depth width of focus was 0.7 µm.

In the example 6, D1 was 200 nm, and the depth width of focus was 0.8 µm.

In the example 7, D1 was 200 nm, and the depth width of focus was 0.8 µm.

In the example 8, D1 was 200 nm, and the depth width of focus was 0.8 µm.

In the example 9, D1 was 200 nm, and the depth width of focus was 0.9 µm.

In the example 10, D1 was 200 nm, and the depth width of focus was 0.9 µm.

In the example 11, D1 was 200 nm, and the depth width of focus was 0.9 µm.

In the example 12, D1 was 200 nm, and the depth width of focus was 0.9 µm.

TABLE 4

|  | Component (A) quantity (parts by weight) | Trench pattern taper angle $\theta_3$ (°) |
|---|---|---|
| Example 5 | 0.2 | 5.0 |
| Example 6 | 0.5 | 6.5 |
| Example 7 | 1.0 | 8.5 |
| Example 8 | 1.5 | 10.5 |
| Example 9 | 2.0 | 12.0 |
| Example 10 | 3.0 | 14.5 |
| Example 11 | 4.0 | 18.0 |
| Example 12 | 4.5 | 20.0 |

Comparative Example 3

Using the resist composition prepared in the aforementioned comparative example 1, when trench patterns were formed in the same manner as the examples 5 to 12, the patterns were of conventional shape with rectangular cross sections.

Comparative Example 4

In the example 5, the positive resist composition was replaced with a non-chemically amplified naphthoquinone-novolak type positive resist composition for use with i-line radiation, the resist film thickness was changed to 0.8 µm, and the exposure apparatus was replaced with an NSRi10D i-line stepper (manufactured by Nikon Corporation), and normal exposure and developing were then used to form a trench pattern. A trench pattern in which D1=350 nm was obtained with a suitable taper shape, but the depth width of focus was 0.3 µm, which is inadequate when compared with the values for the examples.

From the results of the examples 5 to 12 it is evident that the positive resist compositions according to the present invention, which contain the added component (A), exhibit absorption at 248 nm, and when these resist compositions were used to form trench patterns by conducting exposure with a KrF excimer laser, the patterns were of a favorable shape with the side walls displaying a suitable taper angle. Furthermore, fine trench patterns in which D1=200 nm were able to be formed with a good depth width of focus.

Accordingly, if a plating method is used to form a magnetic film within the concave portion of this type of trench pattern, then a magnetic film pattern with the desired inverted taper-shaped cross section can be produced.

Furthermore, from the results of the comparative example 3 it is evident that when a trench pattern was formed using a resist composition that contained no component (A), a conventional rectangular-shaped resist pattern was obtained. If this type of rectangular-shaped resist pattern is used, then the resulting magnetic film pattern has also a conventional rectangular cross-sectional shape.

Furthermore, from the results of the comparative example 4 it is clear that with a non-chemically amplified positive resist composition, the reproducibility of a trench pattern with a favorable taper shape was inadequate, and the depth width of focus was insufficient. If this type of trench pattern is used, then a fine magnetic film pattern cannot be formed with good reproducibility.

The invention claimed is:

1. A positive resist composition comprising a material (A) that exhibits absorption at 248 mm which gives said positive resist composition whose film thickness is 0.3 µm a light transmittance of wavelength 248 nm within a range from 20 to 75%, wherein said material is anthracenemethanol, anthraceneethanol, anthracenecarboxylic acid, anthracene, methylanthracene, dimethylanthracene or hydroxyanthracene, a resin component (B), which contains an acid dissociable, dissolution inhibiting group, and exhibits increased alkali solubility in presence of acid, an acid generator component (C) that generates acid on exposure, and an organic solvent (D) that is capable of dissolving said component (A), said component (B) and said component (C).

2. A positive resist composition according to claim 1, wherein said component (B) comprises a structural unit (b1) derived from hydroxystyrene, a structural unit (b2) derived from styrene, and a structural unit (b3) derived from a (meth)acrylate ester containing an acid dissociable, dissolution inhibiting group.

3. A positive resist composition according to claim 2, wherein respective quantities of said structural units (b1) to (b3) axe from 50 to 80 mol % for (b1), from 0 to 35 mol % for (b2), and from 5 to 40 mol % for (b3) respectively.

4. A positive resist composition according to claim 1, wherein said component (C) is an onium salt with a fluorinated alkylsulfonate ion as an anion.

5. A positive resist composition according to claim 1, wherein said composition is on a magnetic film.

6. A method of forming a magnetic film pattern, comprising the steps of forming a resist pattern, having side walls with a taper-shaped cross section, on top of a magnetic film provided on a substrate with a base film disposed therebetween, using a positive resist composition according to any one of claim 1 through claim 4, and then conducting ion etching of said magnetic film using said resist pattern as a mask.

7. A method of forming a magnetic film pattern, comprising the steps of forming a resist pattern, having side walls with a taper-shaped cross section, on top of a plating seed layer provided on a substrate, using a positive resist composition according to any one of claim 1 through claim 4, and then forming a magnetic film within a concave portion enclosed by said resist pattern using a plating method.

\* \* \* \* \*